(12) United States Patent
Brick et al.

(10) Patent No.: US 7,050,471 B2
(45) Date of Patent: May 23, 2006

(54) SEMICONDUCTOR LASER AND OPTICALLY PUMPED SEMICONDUCTOR DEVICE

(75) Inventors: Peter Brick, Regensburg (DE); Tony Albrecht, Bad Abbach (DE); Norbert Linder, Wenzenbach (DE); Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/791,055

(22) Filed: Mar. 1, 2004

(65) Prior Publication Data

US 2004/0208217 A1    Oct. 21, 2004

(30) Foreign Application Priority Data

Feb. 28, 2003 (GB) .................. 103 08 919
May 12, 2003 (GB) .................. 103 21 246

(51) Int. Cl.
*H01S 5/00* (2006.01)
*H01S 3/04* (2006.01)

(52) U.S. Cl. ............... 372/43.01; 372/45.01; 372/50.1; 372/75

(58) Field of Classification Search ............ 372/43–48, 372/50, 50.1, 50.124, 70, 75; 385/129, 132
See application file for complete search history.

(56) References Cited

U.S. PATENT DOCUMENTS 5,684,817 A * 11/1997 Houdre et al. ........... 372/45.01

5,784,400 A * 7/1998 Joannopoulos et al. ....... 372/96

(Continued)

FOREIGN PATENT DOCUMENTS

DE    100 26 734 A1    12/2001
DE    101 08 079 A1     9/2002

(Continued)

OTHER PUBLICATIONS

Hwang et al.; "Continuous Room-Temperature Operation of Optically Pumped Two-Dimensional Photonic Crystal Lasers at 1.6 micrometers"; IEEE Photonics Technology Letters, vol. 12, No. 10, Oct. 2000.*

(Continued)

*Primary Examiner*—Shih-Chao Chen
*Assistant Examiner*—Leith Al-Nazer
(74) *Attorney, Agent, or Firm*—Cohen, Pontani, Lieberman & Pavane

(57) ABSTRACT

A semiconductor laser with a semiconductor body (1), which has a periodic arrangement of cutouts (2) or in which a period arrangement of semiconductor regions is formed, so that the radiation generated by the semiconductor laser is not capable of propagating within this periodic arrangement, the resonator (3) of the semiconductor laser being omitted from the periodic arrangement in the lateral direction. Furthermore, an optically pumped semiconductor device is disclosed with a vertical emitter (13) comprising a quantum well structure (7), which is pumped by means of a semiconductor laser of this type or into which the pump radiation of a pump radiation source is coupled by means of a corresponding waveguide (22).

19 Claims, 4 Drawing Sheets

U.S. PATENT DOCUMENTS

| | | | | |
|---|---|---|---|---|
| 6,134,369 | A * | 10/2000 | Kurosawa | 385/132 |
| 6,416,575 | B1 * | 7/2002 | Yamada | 117/2 |
| 6,674,778 | B1 * | 1/2004 | Lin et al. | 372/46.01 |
| 6,683,898 | B1 * | 1/2004 | Østergaard et al. | 372/43.01 |
| 6,704,343 | B1 * | 3/2004 | Deng et al. | 372/97 |
| 6,898,362 | B1 * | 5/2005 | Forbes et al. | 385/132 |
| 2002/0001328 | A1 | 1/2002 | Albrecht et al. | |
| 2002/0004307 | A1 | 1/2002 | Yamada | |
| 2005/0152656 | A1 * | 7/2005 | Talneau et al. | 385/129 |

FOREIGN PATENT DOCUMENTS

WO    WO 01/93386 A1    12/2001

OTHER PUBLICATIONS

J. K. Hwang et al., "Continuous Room-Temperature Operation of Optically Pumped Two-Dimensional Photonic Crystal Lasers at 1.6 µm", IEEE Photonics Technology Letters, vol. 12, No. 10, Oct. 2000, pp. 1295-1297.

* cited by examiner

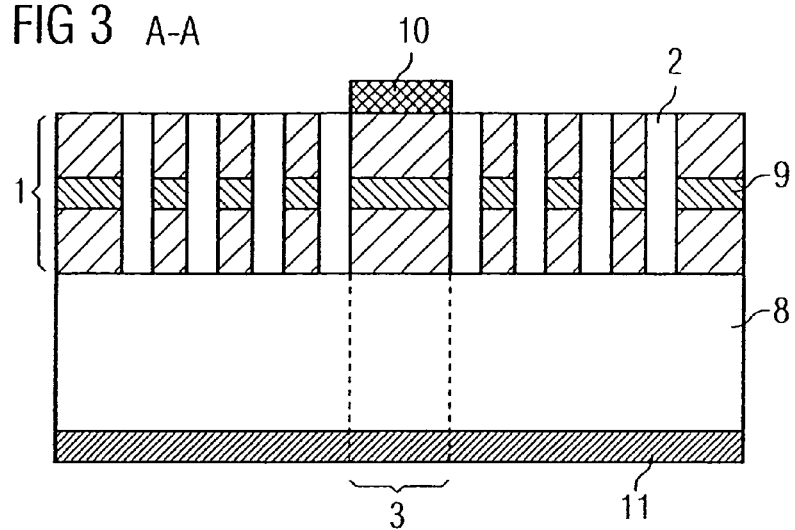
FIG 3 A-A
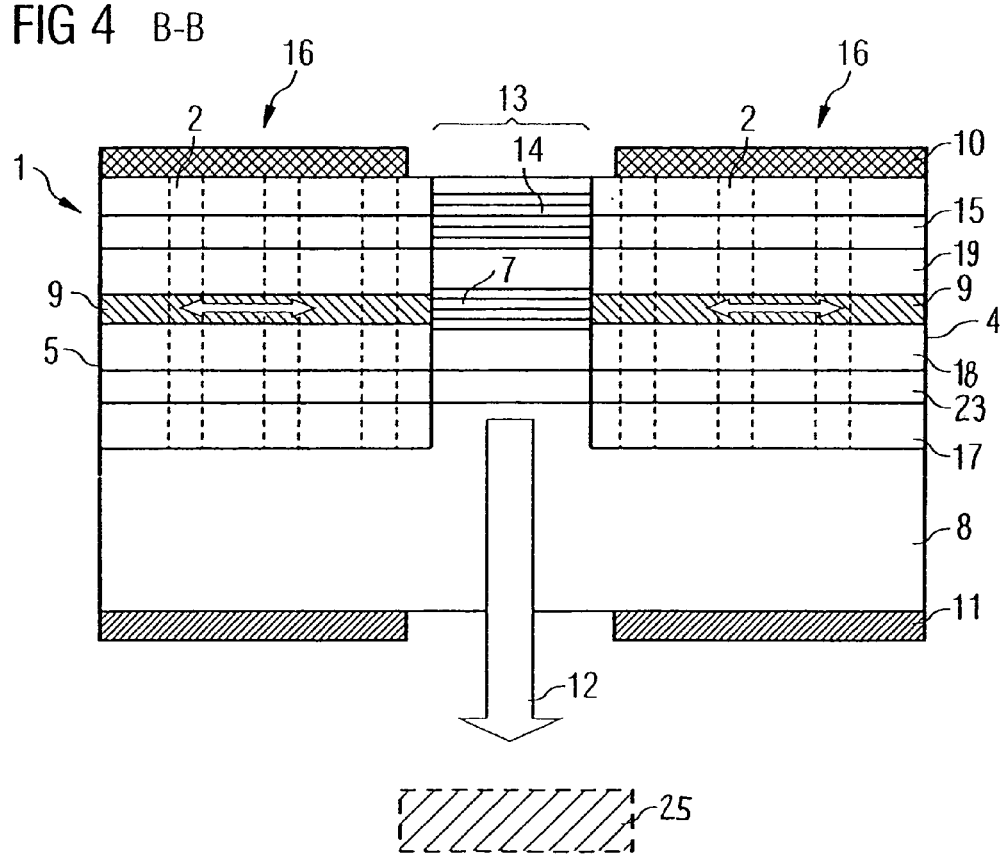
FIG 4 B-B

SEMICONDUCTOR LASER AND OPTICALLY PUMPED SEMICONDUCTOR DEVICE

RELATED APPLICATION

This patent application claims the priority of the German patent applications DE 103 08 919.5, from Feb. 28, 2003, and DE 103 21 246. 9, from May 12, 2003, the disclosure content of which applications is hereby explicitly incorporated by reference into the present description.

FIELD OF THE INVENTION

The invention relates to a semiconductor laser with a semiconductor body having a plurality of discontinuities formed therein, and to an optically pumped semiconductor device with a vertical emitter comprising a quantum well structure, and with a pump radiation source which generates radiation for optically pumping the quantum well structure.

BACKGROUND OF THE INVENTION

An optically pumped semiconductor device is disclosed for example in U.S. patent application Ser. No. 09/824,086, which describes an optically pumped surface emitting semiconductor device with a radiation-generating quantum well structure and with a pump radiation source for optically pumping the quantum well structure, the quantum well structure and the pump radiation source being grown epitaxially on a common substrate.

With optically pumped semiconductor devices of this type, efficient operation requires precise coupling of the pump radiation into the quantum well structure. What is advantageous in this respect is a lateral delimitation of the pump radiation source which restricts the generation of the pump radiation to a region from which the pump radiation can be coupled into the quantum well structure as completely as possible.

If the quantum well structure and the pump radiation source are arranged at a distance from one another, the guiding of the pump radiation from the pump radiation source to the quantum well structure by means of a waveguide may be advantageous. For this purpose, it is possible to use, by way of example, waveguides in which the propagation of the pump radiation is defined by index guiding. Furthermore, it is possible to use index guiding for the lateral delimitation of the pump radiation source. Total reflection constitutes a special case of index guiding in the context of geometrical optics.

Pump lasers, in particular, are suitable as a pump radiation source, the wavelength of which pump lasers can be coordinated exactly with the optimum pump wavelength. A lateral delimitation, in particular of the laser resonator, to a width that is advantageous for coupling into the quantum well structure is likewise expedient in this case.

However, for example in the case of waveguide structures based on index guiding, there is the risk of the index guiding being disturbed on account of inhomogeneities of the waveguide interfaces or deviations from a predetermined ideal waveguide interface, which may be dictated by production, for example, with the result that radiation can exit from the waveguide. This may result in pump radiation losses which may lead to an impairment of the efficiency of the optically pumped semiconductor device or a reduction of the optical output power.

In the case of semiconductor lasers, so-called index guiding and also so-called gain guiding are known for the lateral delimitation of the resonator. In this case, the refractive index or the gain is varied in the lateral direction in such a way that the laser radiation field is generated or amplified only in a strip-like region of predetermined width. As a rule, however, such structures with index or gain guiding are only suitable for rectilinear resonators.

The abovementioned problems are aggravated further if the pump radiation source, in particular in the form of a pump laser, is embodied in angled or curved fashion. Such angled or curved shaping may be advantageous, for example, if a plurality of pump radiation sources pump the quantum well structure and rectilinear feeding of the pump radiation to the quantum well structure is not possible—for example for space reasons. In this case, radiation losses may occur in particular in the region where a waveguide or a pump radiation source is angled or curved, which radiation losses adversely affect the efficiency of the component.

As an alternative to waveguides exhibiting total reflection, it is known to use so-called photonic band structure elements. These elements have a one-dimensionally, two-dimensionally or three-dimensionally lattice-like arrangement of materials having a different refractive index, the lattice constants being chosen in such a way as to produce a band structure with a band gap for electromagnetic waves. The band structure of such a lattice-like arrangement is in certain respects comparable with the band structure of a semiconductor crystal lattice for the associated electron wave functions: in both the photonic band structure element and the semiconductor crystal lattice, the periodicity of the surrounding lattice leads to a relationship between the wave vector and the associated energy with a plurality of (quasi-)continuous regions, the so-called bands, which are separated from one another by so-called forbidden regions or band gaps. Wave functions or electromagnetic waves whose energy lies in the band gap are not capable of propagating within the lattice. In contrast to a crystal lattice, in the case of a photonic band structure element, the lattice-like arrangement is not formed by individual atoms, but rather by a macroscopic arrangement of dielectric media.

An angled optical waveguide with a photonic band structure element which is based on this principle is known for example from U.S. Pat. No. 6,134,369.

SUMMARY OF THE INVENTION

It is an object of the present invention to provide a semiconductor laser having improved lateral guiding which is suitable in particular for optically pumping a quantum well structure.

Another object of the present invention is to provide an improved optically pumped semiconductor device.

These and other objects are attained in accordance with one aspect of the invention directed to a semiconductor laser with a semiconductor body, including a laser resonator. The semiconductor laser includes a plurality of discontinuities formed in a first region of the semiconductor body and arranged such that radiation generated by the semiconductor laser cannot propagate therethrough. A second region of the semiconductor body constitutes the laser resonator, such second region having none of the discontinuities formed therein to enable propagation therethrough of radiation generated by the semiconductor laser.

The term "discontinuities" as used herein is intended to cover a periodic arrangement of cutouts or a periodic arrangement of semiconductor regions.

Preferably, the resonator is formed with an angled or curved resonator axis. Compared with known semiconductor lasers, for instance with index or gain guiding, a semiconductor laser according to the invention is distinguished by low radiation losses. Furthermore, by virtue of the fact that the resonator is defined by the omission of the periodic arrangement, multiform shapings of the resonator are possible with an advantageously low technical outlay, since cutouts are not formed in the semiconductor body only in the regions of the resonator.

What is essential for the formation of the region in which the radiation generated by the semiconductor laser is not capable of propagation is primarily a lattice-like periodic arrangement of zones having a different refractive index. For this purpose, it is possible, on the one hand, to form cutouts in a periodic arrangement in a semiconductor body. On the other hand, it is equally possible for the semiconductor regions themselves to be arranged periodically in a lattice-like fashion, said semiconductor regions being separated from one another by suitable interspaces such as, for example, a continuous cutout. Both the cutouts and the semiconductor regions (which are the inverse structure of the cutouts) can be formed by means of processes which are known in semiconductor technology, e.g. by photolithography and etching. For example, a pattern of holes in a semiconductor as shown in FIG. 1 can be created in a semiconductor. In the same way, a pattern of pin-like semiconductor regions can be fabricated, e.g. by using an inverse mask in the photolithographic process. In both cases, in one advantageous development of the invention, the cutouts or interspaces may be filled with a filling material, for example a dielectric or another semiconductor material, the refractive index of which differs from the refractive index of the semiconductor body.

In accordance with another aspect of the invention, an optically pumped semiconductor device is provided having a vertical emitter comprising a quantum well structure, the quantum well structure of the vertical emitter being pumped by at least one semiconductor laser according to the invention. On account of the advantageously low optical losses mentioned, these semiconductor lasers are particularly suitable as a pump radiation source for optically pumped semiconductor devices.

A monolithically integrated embodiment of the vertical emitter with quantum well structure and of the pump laser is preferred in the case of the invention, so that the quantum well structure to be pumped and the pump laser are thus grown epitaxially on a common substrate.

In one advantageous development of the invention, the quantum well structure is pumped by a plurality of semiconductor lasers, at least one of the pump lasers having a resonator with an angled or curved resonator axis. On account of the lateral delimitation by said periodic arrangement of cutouts or semiconductor regions, the optical losses can also be kept advantageously small with such an angled or curved embodiment of the pump laser. Furthermore, an advantageously space-saving arrangement of a plurality of pump lasers for the quantum well structure is possible in this case.

In accordance with another aspect of the invention, an optically pumped semiconductor device is provided having a vertical emitter comprising a quantum well structure, and with a pump radiation source, which generates radiation for optically pumping the quantum well structure, the pump radiation being coupled into the quantum well structure by means of a waveguide which is laterally delimited at least partly by a periodic arrangement of cutouts or semiconductor regions in such a way that the pump radiation is not capable of propagating within said arrangement. Furthermore, a low-loss angled or curved waveguide can be realized by virtue of the lateral delimitation of the waveguide by the periodic arrangement.

It goes without saying that, in the context of the invention, the individual embodiments can also be combined, so that, by way of example, a semiconductor laser according to the invention is used as a pump radiation source, the pump radiation of which laser is guided to the quantum well structure by means of the above-described waveguide that is laterally delimited by a periodic arrangement of cutouts or semiconductor regions. In a particularly preferable manner, such a device is embodied in a monolithically integrated fashion with an optically pumped quantum well structure, a waveguide and, if appropriate, a pump laser.

BRIEF DESCRIPTION OF THE DRAWINGS

Further features, advantages and expediencies of the invention emerge from the following description of exemplary embodiments of the invention in conjunction with FIGS. 1 to 7, in which:

FIG. 3 shows a diagrammatic sectional view of the exemplary embodiment shown in FIG. 2 taken along the line A—A, FIG. 4 shows a diagrammatic sectional view of the exemplary embodiment shown in FIG. 2 taken along the line B—B.

DETAILED DESCRIPTION OF THE DRAWINGS

Identical or identically acting elements are provided with the same reference symbols in the figures.

Figure 1:
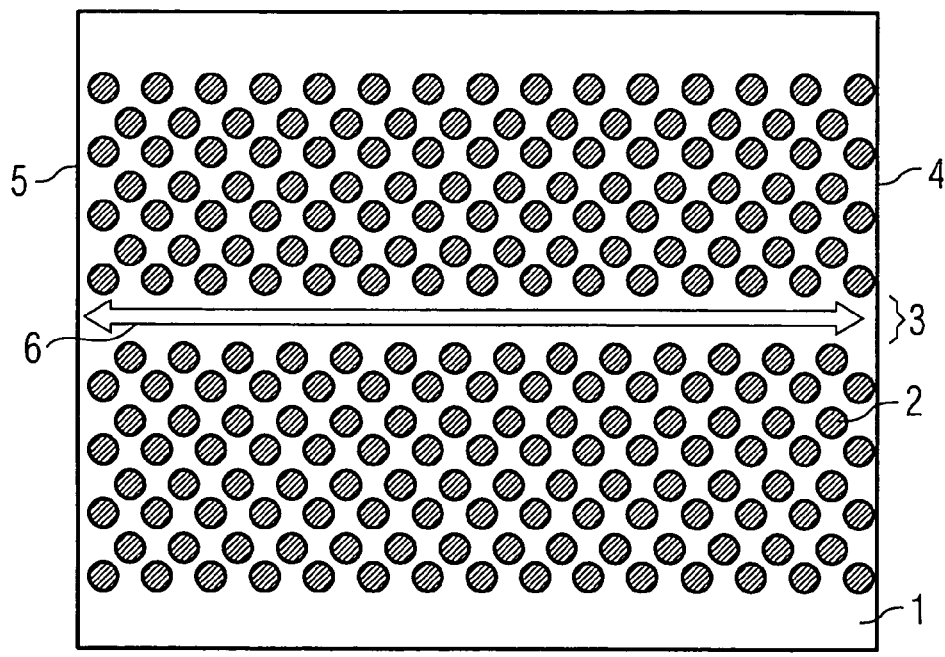
FIG. 1 shows a diagrammatic plan view of an exemplary embodiment of a semiconductor laser according to the invention.

The semiconductor laser shown in FIG. 1 comprises a semiconductor body 1, in which a plurality of cutouts 2 are formed. Said cutouts are arranged periodically in a lattice-like fashion, the lattice spacing being chosen such that the radiation generated by the semiconductor laser is not capable of propagating within this arrangement. In this case, the distance between two adjacent cutouts is preferably of the order of magnitude of the wavelength of the laser radiation, for example approximately in the region of half the wavelength of the laser radiation or a multiple of the half wavelength. What is critical for the distance is the wavelength in the semiconductor body, i.e. the optical path length between two adjacent cutouts.

Details in this respect can be gathered from the above-mentioned document U.S. Pat. No. 6,134,369. It goes without saying that FIG. 1 is not true to scale and, in particular, does not represent the spacing and size of the cutouts to scale. Furthermore, a lattice-like arrangement of another lattice type, two-dimensionally for example in the manner of a hexagonal, rhombic or trigonal lattice, may also be provided in the context of the invention. The same applies correspondingly to a three-dimensional lattice-like arrangement.

The resonator 3 of the semiconductor laser is formed as a strip-type region in which the periodic arrangement of cutouts is interrupted. The laser radiation to be generated is capable of propagating in this strip-type region omitted from the periodic arrangement, so that the laser radiation field can build up between the side areas 4 and 5 serving as resonator mirror areas.

The lateral delimitation of the resonator perpendicular to the resonator axis B—B is thus formed by the respective periodic arrangement of cutouts, which forms a band structure with a band gap for electromagnetic waves, the lattice constant of the periodic arrangement being chosen such that the energy or wavelength of the electromagnetic waves to be generated lies within the band gap. An efficient and advantageously loss-free lateral delimitation of the semiconductor laser is thus realized.

Figure 2:
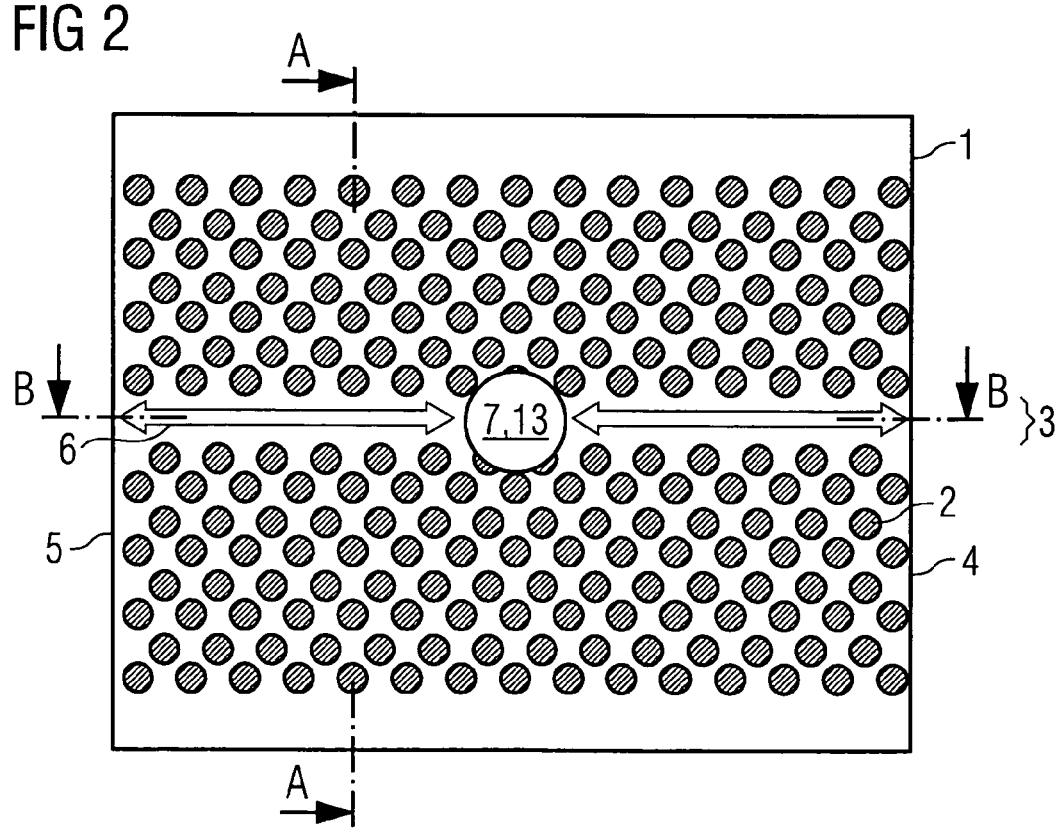
FIG. 2 shows a diagrammatic plan view of a first exemplary embodiment of an optically pumped semiconductor device according to the invention.

FIG. 2 illustrates an exemplary embodiment of an optically pumped semiconductor device according to the invention. As in the exemplary embodiment shown in FIG. 1, a semiconductor body 1 with an arrangement of cutouts 2 that is periodic in a lattice-like fashion is provided, a strip-like region being omitted from the cutouts and forming the resonator 3 of a semiconductor laser. This semiconductor laser serves as pump laser 16 for an optically pumped, vertically emitting quantum well structure 7 of a vertical emitter 13 arranged in the laser resonator 3.

In this case, the width of the region which is omitted in strip-like fashion and forms the resonator of the pump laser 16 is dimensioned in such a way that the pump radiation 6 generated is coupled into the quantum well structure 7 as completely as possible.

FIG. 3 illustrates a cross section of this optically pumped semiconductor device along the line A—A shown in FIG. 2. The semiconductor body 1 is grown onto a substrate 8 in the form of a plurality of epitaxial layers. In particular, the semiconductor body 1 comprises a radiation-emitting active layer 9.

A plurality of cutouts 2 cut through the epitaxial layers, said cutouts running perpendicularly to the surface 8 of the substrate or the layer plane of the epitaxial layers. As illustrated in FIG. 2, these arrangements are arranged in lattice-like fashion periodically in said layer plane and laterally delimit the resonator 3 of the semiconductor laser. In the region of the resonator 3, a first contact metalization 10 is formed on the top side of the semiconductor body and a second contact metalization 11 is formed oppositely on that side of the substrate which is remote from the semiconductor body, for the electrical supply of the semiconductor laser. It goes without saying that here, too, the cutouts, the spacing thereof and the width of the resonator 3, in comparison with the dimensions and the arrangement of the cutouts, are not illustrated true to scale. Furthermore, the cutouts may also run in other directions which need not necessarily be orthogonal to the surface of the substrate.

FIG. 4 diagrammatically illustrates a longitudinal section through the optically pumped semiconductor device illustrated in FIG. 2 along the resonator axis B—B. The vertical emitter 13 comprises a quantum well structure 7 spaced from a mirror structure 14, said mirror structure preferably being formed as a Bragg mirror. Each one of structures 7 and 14 can be arranged above or below the other, and additional layers can be arranged therebetween. The radiation 12 generated by the vertical emitter is radiated through the substrate 8. Preferably, an external mirror 25 may be provided in order to form a VECSEL (Vertical External Cavity Surface Emitting Laser).

The centrally formed vertical emitter 13 is adjoined laterally in each case by a region of the pump laser 16. The pump laser 16 comprises an active layer 9 arranged between a first waveguide layer 18 and a second waveguide layer 19, the two waveguide layers 18 and 19 forming a waveguide for the pump laser 16 in the vertical direction. Said waveguide is in turn arranged between two cladding layers 15 and 23 spaced from each other. Each one of layers 15 and 23 can be arranged above or below the other, and additional layers can be arranged therebetween.

For efficiently coupling in the pump radiation, it is particularly advantageous in the case of an optically pumped semiconductor device of this type to arrange the quantum well structure 7 of the vertical emitter 13 and the active layer 9 of the pump laser approximately at the same height above the substrate surface, in which case an exactly identical height may be advantageous, but is not absolutely necessary. For this purpose, in the case of the pump laser 16, a buffer layer 17 is grown on the substrate, said buffer layer, inter alia, compensates for height differences between the quantum well structure 7 and the active layer 9 of the pump laser 16. In the optically pumped semiconductor device shown, the outer side areas 4 and 5 of the semiconductor body 1 in each case serve as resonator mirrors.

Cutouts 2 are formed in the semiconductor body 1 outside the resonator of the pump laser 16, which cutouts cut through the epitaxial layers in the vertical direction to the substrate and, as illustrated in FIG. 2, are arranged periodically in lattice-like fashion in the layer plane of the epitaxial layers in such a way that the radiation generated by the pump laser 16 is not capable of propagating within this periodic arrangement. The abovementioned low-loss and advantageous lateral delimitation of the pump laser 16 is thereby realized.

Figure 5:
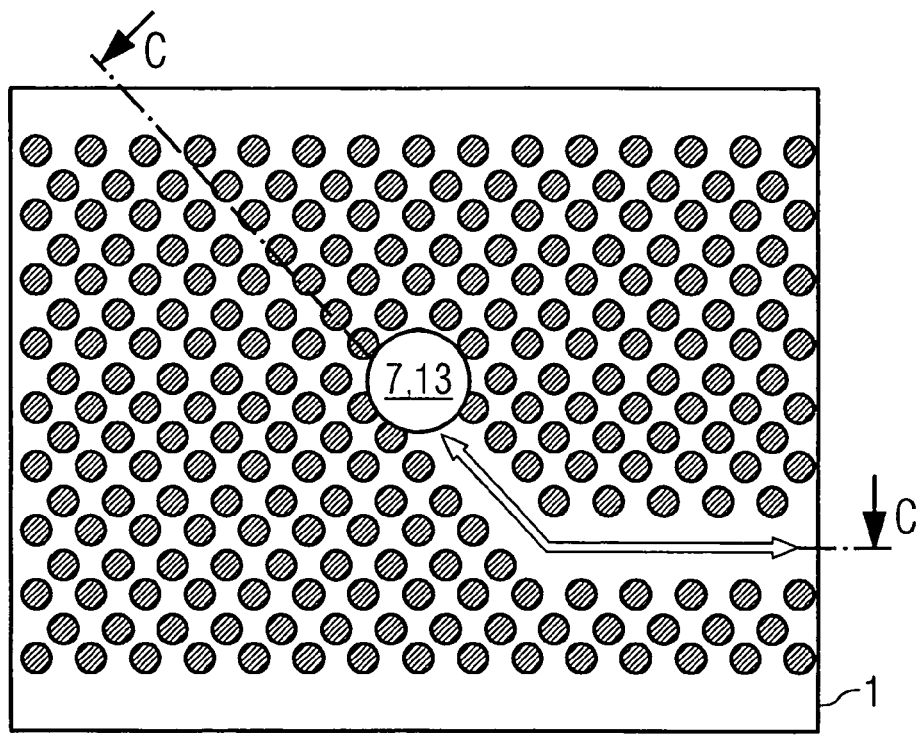
FIG. 5 shows a diagrammatic plan view of a second exemplary embodiment of an optically pumped semiconductor device according to the invention.

FIG. 5 shows a second exemplary embodiment of an optically pumped semiconductor device according to the invention. This exemplary embodiment essentially corresponds to the exemplary embodiment shown in FIG. 2 with the difference that provision is made of a semiconductor laser for pumping a vertical emitter 13 with a quantum well structure 7, the resonator axis C—C of which is formed in angled fashion. An arrangement of cutouts that is periodic in lattice-like fashion is once again provided in the semiconductor body, said arrangement being omitted along the resonator axis C—C in a strip-like and angled region. As in the previous exemplary embodiment, this arrangement of cutouts that is periodic in lattice-like fashion forms a band structure with a band gap, so that the pump radiation generated by the semiconductor laser is not capable of propagating within the periodic arrangement. What is particularly advantageous in this case is that it is also the case with the angled embodiment of the resonator shown that a low-loss lateral delimitation is made possible by means of said periodic arrangement or the corresponding omission within the resonator region.

Figure 6:
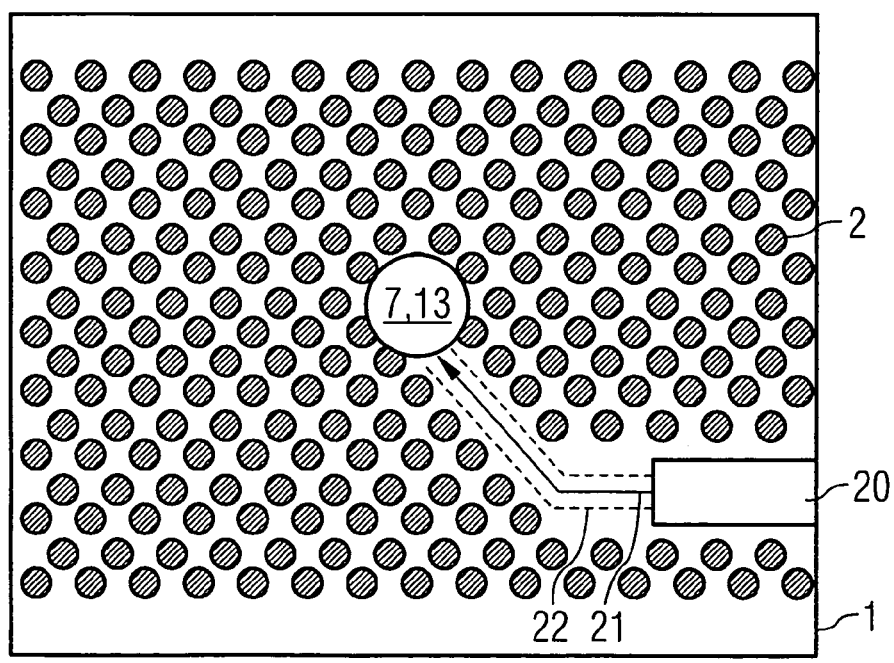
FIG. 6 shows a diagrammatic plan view of a third exemplary embodiment of an optically pumped semiconductor device according to the invention.

FIG. 6 illustrates a third exemplary embodiment of an optically pumped semiconductor device according to the invention, which corresponds to a modification of the exemplary embodiment shown in FIG. 5. As in the last-mentioned exemplary embodiment, provision is made of a semiconductor body 1 with a periodic arrangement of cutouts 2 and with a vertical emitter 13 with a quantum well structure 7 and a pump radiation source 20, the pump radiation 21 generated by the pump radiation source 20 being coupled into the quantum well structure 7 of the vertical emitter 13 by means of a waveguide 22. Said waveguide 22 is formed by a strip-like angled region in which the periodic arrangement of cutouts is omitted or which is laterally delimited by the periodic arrangement of cutouts. This angled embodiment of a waveguide 22 with lateral delimitation by said periodic arrangement of cutouts is distinguished by low radiation losses of the pump radiation 21. Furthermore, it is also possible to produce other waveguide forms and courses without special technical outlay by means of correspondingly formed omissions in the periodic arrangement of cutouts.

Figure 7:
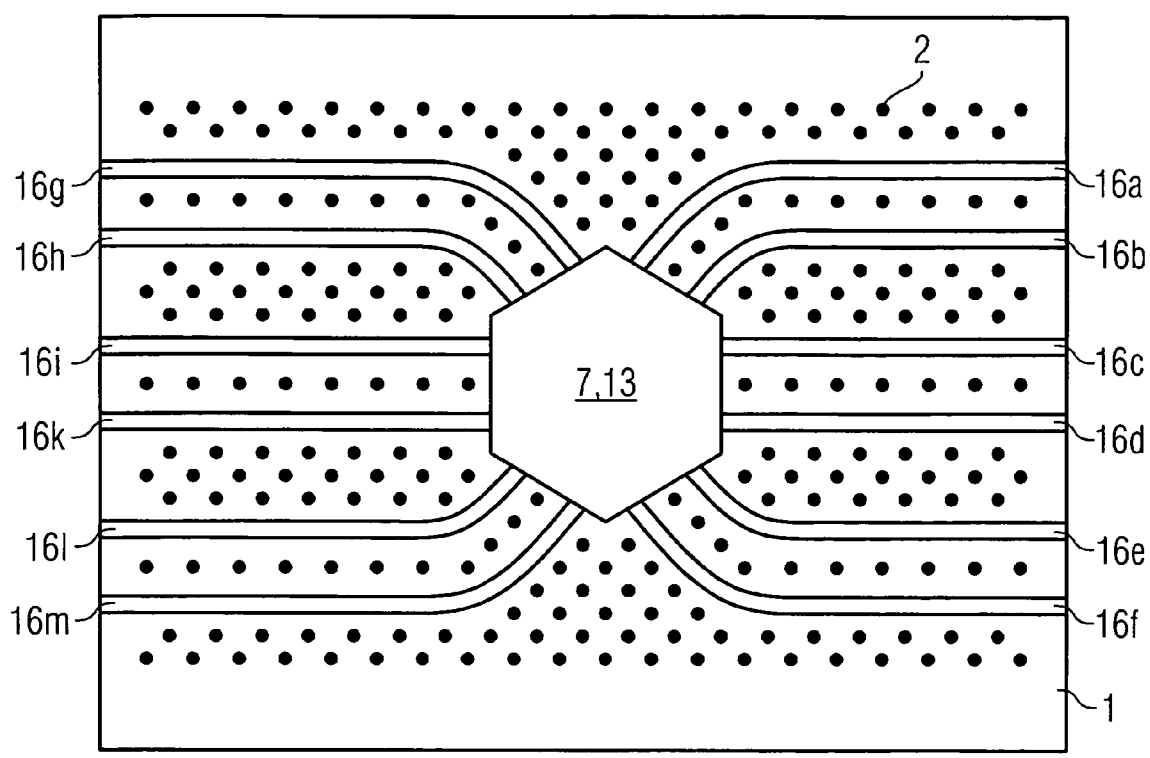
FIG. 7 shows a diagrammatic plan view of a fourth exemplary embodiment of an optically pumped semiconductor device according to the invention.

FIG. 7 shows a fourth exemplary embodiment of an optically pumped semiconductor device according to the invention with a plurality of pump lasers 16a, 16b . . . 16m, which jointly pump a quantum well structure 7 of a centrally formed vertical emitter 13. As in the previous exemplary embodiments, a periodic arrangement of cutouts 2 is formed in the semiconductor body 1, said arrangement in each case being omitted along the resonator of the pump lasers 16a, 16b . . . 16m in a strip-like region. In this case, the pump lasers 16a, 16b . . . 16m are formed partly rectilinearly as in the exemplary embodiment shown in FIG. 2, and partly in curved or angled fashion in accordance with the exemplary embodiment illustrated in FIG. 5.

In this way, a plurality of pump lasers can be arranged in a space-saving manner. At the same time, the pump radiation is coupled efficiently into the quantum well structure of the vertical emitter. In particular, the partly curved or angled embodiment of the pump lasers is advantageous for this purpose.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. A semiconductor laser with a semiconductor body, including a laser resonator, comprising:
   a plurality of discontinuities formed in a first region of said semiconductor body and arranged in an arrangement such that radiation generated by the semiconductor laser cannot propagate through said first region, and
   a second region of said semiconductor body constituting the laser resonator, said second region being formed by an interruption of said arrangement and having none of said discontinuities formed therein, to enable propagation of radiation generated by the semiconductor laser through said second region.

2. The semiconductor laser as claimed in claim 1, wherein the resonator has an angled or curved resonator axis.

3. The semiconductor laser as claimed in claim 1, wherein the discontinuities are filled with a filling material, a refractive index of said filling material being different from a refractive index of said semiconductor body.

4. The semiconductor laser as claimed in claim 1, wherein said first and second semiconductor body regions adjoin a filling material, a refractive index of said filling material being different from a refractive index of said first and second semiconductor body regions.

5. The semiconductor laser as claimed in claim 1, wherein said discontinuities comprise a periodic arrangement of cutouts.

6. The semiconductor laser as claimed in claim 1, wherein said discontinuities comprise a periodic arrangement of semiconductor regions.

7. The semiconductor as claimed in claim 1, wherein said semiconductor body comprises outer side areas forming resonator mirrors of said laser resonator.

8. An optically pumped semiconductor device with a vertical emitter comprising a quantum well structure, wherein said quantum well structure of said vertical emitter is optically pumped by at least one semiconductor laser as claimed in claim 1.

9. The optically pumped semiconductor device as claimed in claim 8, wherein said vertical emitter and said semiconductor laser are grown epitaxially on a common substrate.

10. An optically pumped semiconductor device with a vertical emitter comprising a quantum well structure wherein said quantum well structure of said vertical emitter is pumped by a plurality of semiconductor lasers as claimed in claim 1, at least one of said semiconductor lasers having a resonator with an angled or curved resonator axis.

11. An optically pumped semiconductor device with a vertical emitter comprising a quantum well structure, and with a pump radiation source, which generates pump radiation for optically pumping said quantum well structure, comprising:
   a waveguide for coupling said pump radiation into said quantum well structure, wherein said waveguide is laterally delimited at least partly by an arrangement of a plurality of discontinuities arranged in such a way that said pump radiation is not capable of propagating within said arrangement.

12. The optically pumped semiconductor device as claimed in claim 11, wherein said discontinuities are filled with a filling material, a refractive index of said filling material being different from a refractive index of said semiconductor body.

13. The optically pumped semiconductor device as claimed in claim 11, wherein said semiconductor regions adjoin a filling material, a refractive index of said filling material being different from a refractive index of said semiconductor regions.

14. The optically pumped semiconductor device as claimed in claim 11, wherein said pump radiation source is a semiconductor laser with a semiconductor body, including a laser resonator, comprising:
   a first region of said semiconductor body, the plurality of discontinuities being formed in said first region of said semiconductor body and arranged such that radiation generated by said semiconductor laser cannot propagate through said first region, and
   a second region of said semiconductor body constituting said laser resonator, said second region having none of said discontinuities formed therein, to enable propagation of radiation generated by the semiconductor laser through said second region.

15. The optically pumped semiconductor device as claimed in claim 14, said second region being formed as an interruption of said arrangement of discontinuities.

16. The optically pumped semiconductor device as claimed in claim 11, wherein said vertical emitter and said pump radiation source are grown epitaxially on a common substrate.

17. The optically pumped semiconductor device as claimed in claim 11, wherein said discontinuities comprise a periodic arrangement of cutouts.

18. The optically pumped semiconductor device as claimed in claim 11, wherein said discontinuities comprise a periodic arrangement of semiconductor regions.

19. The optically pumped semiconductor device as claimed in claim 11, wherein said waveguide and said quantum well structure are monolithically integrated.

* * * * *

UNITED STATES PATENT AND TRADEMARK OFFICE
CERTIFICATE OF CORRECTION

PATENT NO. : 7,050,471 B2  
APPLICATION NO. : 10/791055  
DATED : May 23, 2006  
INVENTOR(S) : Peter Brick et al.

It is certified that error appears in the above-identified patent and that said Letters Patent is hereby corrected as shown below:

Replace item no. 30 on the title page with the following:

-- (30)  Foreign Application Priority Data

Feb. 28, 2003 (DE)    103 08 919

May 12, 2003 (DE)    103 21 246 --

Signed and Sealed this

Thirtieth Day of January, 2007

JON W. DUDAS  
*Director of the United States Patent and Trademark Office*